(12) United States Patent
Hanari

(10) Patent No.: US 10,608,018 B2
(45) Date of Patent: Mar. 31, 2020

(54) DISPLAY DEVICE

(71) Applicant: Japan Display Inc., Minato-ku (JP)

(72) Inventor: Jun Hanari, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/924,340

(22) Filed: Mar. 19, 2018

(65) Prior Publication Data

US 2018/0277569 A1    Sep. 27, 2018

(30) Foreign Application Priority Data

Mar. 21, 2017    (JP) .................................. 2017-054297

(51) Int. Cl.
*H01L 27/12* (2006.01)
*H01L 51/00* (2006.01)
*H01L 27/32* (2006.01)

(52) U.S. Cl.
CPC ........ *H01L 27/124* (2013.01); *H01L 27/1218* (2013.01); *H01L 27/3276* (2013.01); *H01L 51/0097* (2013.01); *H01L 2251/5338* (2013.01)

(58) Field of Classification Search
CPC ............... H01L 27/124; H01L 51/0097; H01L 2251/5338
See application file for complete search history.

(56) References Cited

U.S. PATENT DOCUMENTS

| | | | | | |
|---|---|---|---|---|---|
| 5,428,190 A | * | 6/1995 | Stopperan | ............... | H05K 3/323 174/250 |
| 5,600,179 A | * | 2/1997 | Suzuki | ................ | H01L 23/3121 257/690 |
| 6,358,772 B2 | * | 3/2002 | Miyoshi | ............... | H01L 23/3107 438/106 |
| 6,956,288 B2 | * | 10/2005 | Ueno | ................... | G02F 1/13452 257/734 |
| 7,348,492 B1 | * | 3/2008 | Kawai | ................. | G02F 1/13452 174/254 |
| 8,031,143 B2 | * | 10/2011 | Sung | ................... | H01L 27/3276 345/82 |
| 8,053,293 B2 | * | 11/2011 | Kim | ...................... | G02F 1/1309 257/E21.521 |
| 9,276,055 B1 | * | 3/2016 | Son | ..................... | H01L 27/3276 |

(Continued)

FOREIGN PATENT DOCUMENTS

JP            2016-76146         5/2016

*Primary Examiner* — Ida M Soward
(74) *Attorney, Agent, or Firm* — Oblon, McClelland, Maier & Neustadt, L.L.P.

(57) ABSTRACT

A display device includes first, second and third connection wiring. The second connection wiring is located in a same layer as the first connection wiring. The third connection wiring is located in a layer different from the first connection wiring. The first connection wiring includes at least one first region running in a first direction and at least one second region running in a second direction different from the first direction. The second connection wiring includes at least one third region running in the first direction and at least one fourth region running in the second direction. The third connection wiring includes at least one fifth region running in the first direction and at least one sixth region running in the second direction. The at least one first region, the at least one third region, and the at least one fifth region are adjacent to one another.

20 Claims, 7 Drawing Sheets

(56) References Cited

U.S. PATENT DOCUMENTS

| | | | | |
|---|---|---|---|---|
| 9,287,342 B2* | 3/2016 | Kwon | .................. | H01L 27/3276 |
| 9,349,969 B2* | 5/2016 | Kwon | .................. | H01L 51/0097 |
| 9,401,335 B2* | 7/2016 | Kasai | ....................... | H01L 23/60 |
| 9,411,203 B2* | 8/2016 | Kimura | ............... | G02F 1/13452 |
| 9,865,670 B2* | 1/2018 | Park | .................... | H01L 27/3276 |
| 9,929,374 B2* | 3/2018 | Jin | ...................... | H01L 51/5246 |
| 9,991,456 B2* | 6/2018 | Senda | ................. | H01L 51/5253 |
| 10,121,988 B2* | 11/2018 | Oh | ......................... | H01L 27/323 |
| 2002/0180022 A1* | 12/2002 | Emoto | ............... | H01L 23/3107 |
| | | | | 257/686 |
| 2005/0241853 A1* | 11/2005 | Aoki | .................... | G02F 1/1345 |
| | | | | 174/261 |
| 2006/0223346 A1* | 10/2006 | Fujii | ....................... | G06F 3/041 |
| | | | | 439/76.2 |
| 2008/0259237 A1* | 10/2008 | Kim | .................... | G02F 1/13454 |
| | | | | 349/43 |
| 2011/0169791 A1* | 7/2011 | Hida | .................... | G02F 1/1345 |
| | | | | 345/204 |
| 2014/0217397 A1* | 8/2014 | Kwak | ................. | H01L 27/1218 |
| | | | | 257/43 |
| 2014/0232956 A1 | 8/2014 | Kwon et al. | | |
| 2016/0172428 A1* | 6/2016 | Song | .................... | H01L 27/3276 |
| | | | | 257/99 |
| 2016/0174304 A1 | 6/2016 | Kim et al. | | |
| 2016/0336523 A1* | 11/2016 | Kwon | .................. | H01L 27/3276 |
| 2017/0062760 A1* | 3/2017 | Kim | ..................... | H01L 51/5253 |
| 2017/0212394 A1* | 7/2017 | Araki | ................. | G02F 1/134309 |
| 2017/0257939 A1* | 9/2017 | Sano | ....................... | H05K 3/361 |
| 2017/0302772 A1 | 10/2017 | Zhang et al. | | |
| 2018/0041666 A1* | 2/2018 | Nakayama | ............. | H01L 27/14 |

* cited by examiner

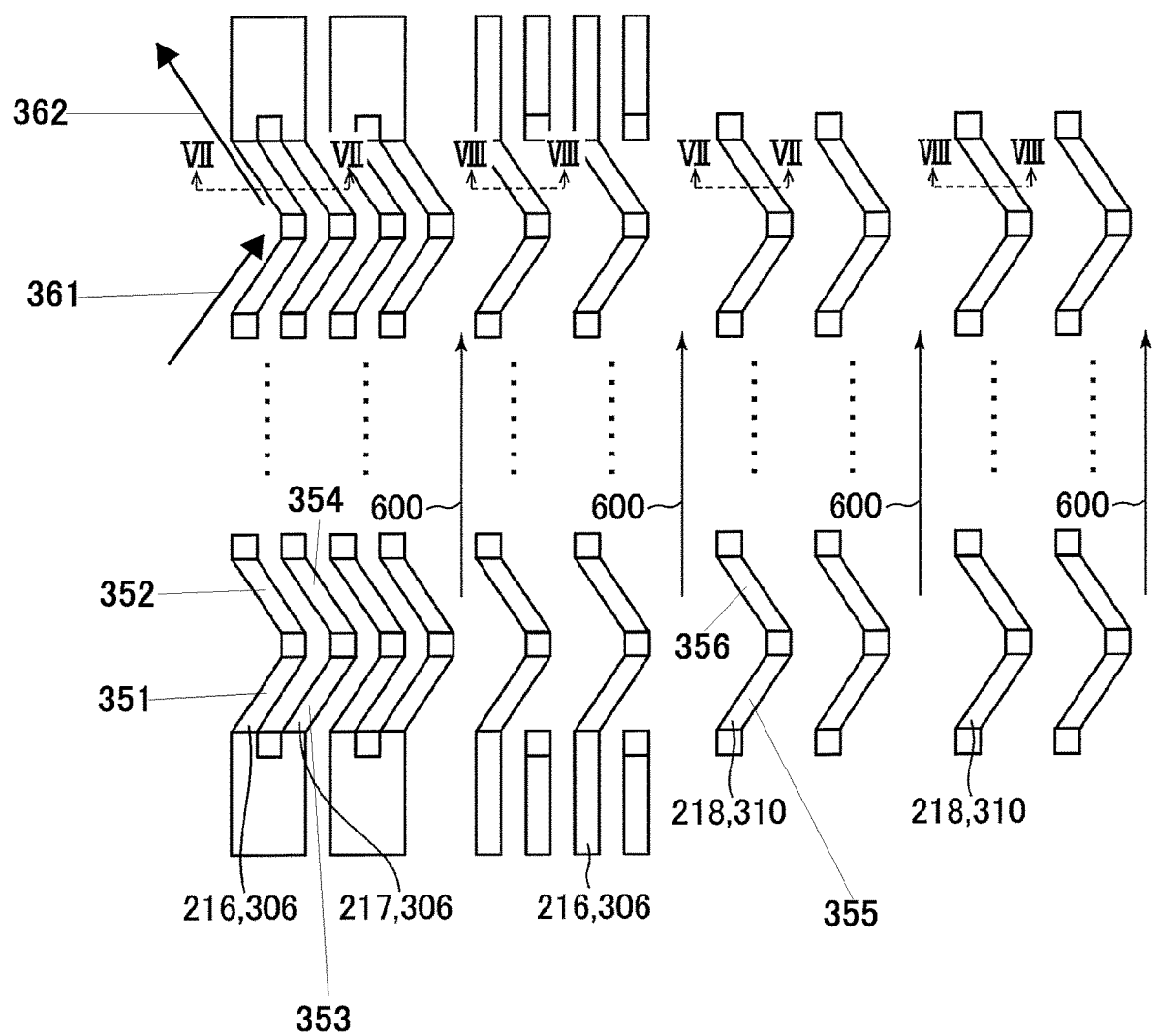

DISPLAY DEVICE

CROSS-REFERENCE TO RELATED APPLICATION

The present application claims priority from Japanese application JP2017-54297 filed on Mar. 21, 2017, the content of which is hereby incorporated by reference into this application.

BACKGROUND OF THE INVENTION

1. Field of the Invention

The present invention relates to a display device.

2. Description of the Related Art

A flat panel display such as an organic electroluminescent (EL) display device includes a display panel in which a thin film transistor, an organic light-emitting diode, and the like are formed on a substrate. A glass substrate has been conventionally used as a base material of the display panel. In recent years, with a resin film, such as a polyimide film, or the like being used as the base material, development of a bendable flexible display has progressed.

In the flexible display, a mounting section for an integrated circuit or an electronic component is disposed outside an image display region. The base material of the flexible display is folded, so that the integrated circuit or the mounting section can be disposed on the rear side of the display region. Hence, a picture frame can be made small in the flexible display.

JP 2016-76146 A discloses a touch panel sensor in which lead-out wirings are disposed obliquely with respect to a bent direction at a position where the base material is folded.

Moreover, U.S. Patent Application Publication No. 2014/0232956 discloses that wirings on a flexible substrate are disposed in a zigzag shape so as to be able to withstand mechanical stress caused by bending of a flexible substrate.

SUMMARY OF THE INVENTION

However, the shape of the wirings disclosed in JP 2016-76146 A is a shape composed of rhombic shapes combined together. The shape has a small conductor forming area per unit area. Therefore, it is impossible to achieve a lower resistance of the wiring disposed on a curved region. Moreover, in order to achieve a lower resistance of the wiring, it is necessary to dispose a plurality of wirings, and thus there is a problem in that the placement area of the wirings is increased.

The shape of the wirings disclosed in U.S. Patent Application Publication No. 2014/0232956 is a zigzag shape. The shape of the wirings has a large area where the wirings are disposed. Moreover, when the wirings are made thin in order to reduce the area where the wirings are disposed, the resistance of the wirings is increased. Further, it is difficult to reduce the resistance of the wirings because the wirings are disposed in a single layer.

The disclosure has been made in view of the problems described above, and it is an object thereof to prevent the disconnection of a connection wiring and reduce the arrangement area of the connection wiring by obliquely disposing the connection wiring with respect to a bent direction of a substrate.

According to one aspect of the present invention, there is provided a display device including: an insulating substrate including a display region, a contact section disposed outside the display region and on the insulating substrate, and first connection wiring, second connection wiring, and third connection wiring which are connected with the contact section, each of the first to third connection wirings including a portion located between the contact section and the display region. The second connection wiring is located in a same layer as the first connection wiring. The third connection wiring is located in a layer different from the first connection wiring. The first connection wiring includes at least one first region running in a first direction and at least one second region running in a second direction different from the first direction. The second connection wiring includes at least one third region running in the first direction and at least one fourth region running in the second direction. The third connection wiring includes at least one fifth region running in the first direction and at least one sixth region running in the second direction. The at least one first region, the at least one third region, and the at least one fifth region are adjacent to one another.

In the above-mentioned aspects of the invention, the at least one second region, the at least one fourth region, and the at least one sixth region are adjacent to one another.

In the above-mentioned aspects of the invention, the at least one first region includes first regions. The at least one second region includes second regions. The first connection wiring includes a portion where the first regions and the second regions are arranged alternately one by one.

In the above-mentioned aspects of the invention, the first connection wiring is electrically connected with the second connection wiring and the third connection wiring.

In the above-mentioned aspects of the invention, a pixel is located in the display region. A power supply voltage is supplied to the pixel. The power supply voltage is applied to the first connection wiring.

In the above-mentioned aspects of the invention, a curved region where the insulating substrate is curved is located between the contact section and the display region. A portion of the first connection wiring, a portion of the second connection wiring, and a portion of the third connection wiring are located in the curved region.

In the above-mentioned aspects of the invention, the first connection wiring is covered with a first inorganic insulating film. The third connection wiring is located on the first inorganic insulating film.

In the above-mentioned aspects of the invention, the first inorganic insulating film includes a first portion covering the first connection wiring, and a second portion separated from the first portion and covering the second connection wiring.

In the above-mentioned aspects of the invention, the first inorganic insulating film includes a third portion separated from the first portion and the second portion, and the third connection wiring is located on the third portion.

In the above-mentioned aspects of the invention, the display device further includes an under film and a first inorganic insulating film located between the under film and the third connection wiring. The first connection wiring is located on the under film. The first inorganic insulating film does not overlap the first connection wiring.

In the above-mentioned aspects of the invention, the third connection wiring is located between the first connection wiring and the second connection wiring in a plan view.

In the above-mentioned aspects of the invention, a pixel and a thin film transistor are located in the display region.

The first connection wiring is located in a same layer as a gate electrode of the thin film transistor.

In the above-mentioned aspects of the invention, a pixel and a thin film transistor are located in the display region. The pixel includes a lower electrode, an upper electrode, and a light-emitting layer. The thin film transistor and the lower electrode are connected by a wiring. The third connection wiring is located in a same layer as the wiring.

According to another aspect of the present invention, there is provided a display device including: an insulating substrate including a display region, a contact section disposed outside the display region and on the insulating substrate; and first connection wiring and third connection wiring which are connected with the contact section and both of the first and second connection wirings including a portion located between the contact section and the display region. The third connection wiring is located in a layer different from the first connection wiring. The first connection wiring includes at least one first region running in a first direction and at least one second region running in a second direction different from the first direction. The third connection wiring includes at least one fifth region running in the first direction and at least one sixth region running in the second direction. The at least one first region and the at least one fifth region are adjacent to each other.

In the above-mentioned aspects of the invention, the at least one second region and the at least one sixth region are adjacent to each other.

In the above-mentioned aspects of the invention, the at least one first region includes first regions. The at least one second region includes second regions. The first connection wiring includes a portion where the first regions and the second regions are arranged alternately one by one.

In the above-mentioned aspects of the invention, a curved region where the insulating substrate is curved is located between the contact section and the display region. A portion of the first connection wiring and a portion of the third connection wiring are located in the curved region.

In the above-mentioned aspects of the invention, the first connection wiring is covered with a first inorganic insulating film. The third connection wiring is located on the first inorganic insulating film.

In the above-mentioned aspects of the invention, the first inorganic insulating film includes a first portion covering the first connection wiring, and a third portion separated from the first portion. The third connection wiring is located on the third portion.

In the above-mentioned aspects of the invention, a pixel and a thin film transistor are located in the display region. The pixel includes a lower electrode, an upper electrode, and a light-emitting layer. The thin film transistor and the lower electrode are connected by a wiring. The first connection wiring is located in a same layer as a gate electrode of the thin film transistor. The third connection wiring is located in a same layer as the wiring.

BRIEF DESCRIPTION OF THE DRAWINGS

FIGS. 6A to 6D are diagrams of first to third connection wirings as viewed in plan.

DETAILED DESCRIPTION OF THE INVENTION

Figure 1:
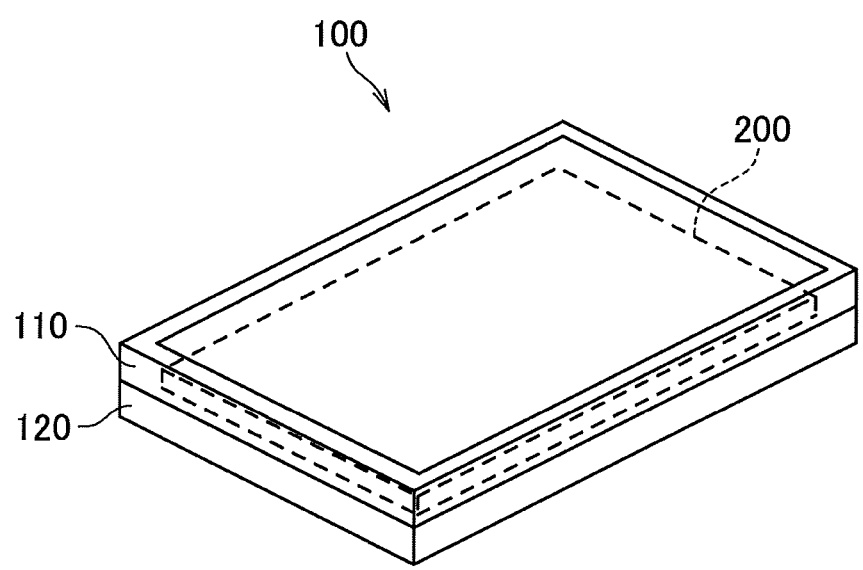
FIG. 1 is a diagram schematically showing an organic EL display device according to an embodiment of the invention.

Hereinafter, an embodiment of the invention will be described with reference to the drawings. In the drawings, the width, thickness, shape, and the like of each part may be schematically represented, compared to those in practicing aspects of the invention, for more clarity of description. However, they are illustrative only and do not limit the interpretation of the invention. In the specification and the drawings, elements similar to those described in relation to a previous drawing are denoted by the same reference numerals and signs, and a detailed description may be appropriately omitted.

In the following embodiment, an organic EL display device is exemplified as an example of the disclosure. However, other application examples include all types of flat panel display devices such as a liquid crystal display device and other self-emitting display devices, or an electronic paper display device including an electrophoretic element. Moreover, it is needless to say that the invention can be applied, without particular limitations, to small and medium to large display devices.

FIG. 1 is a diagram showing an outline of an organic EL display device 100 according to an embodiment of the invention. As shown in the drawing, the organic EL display device 100 is configured to include an organic EL panel 200 fixed so as to be interposed between an upper frame 110 and a lower frame 120.

Figure 2:
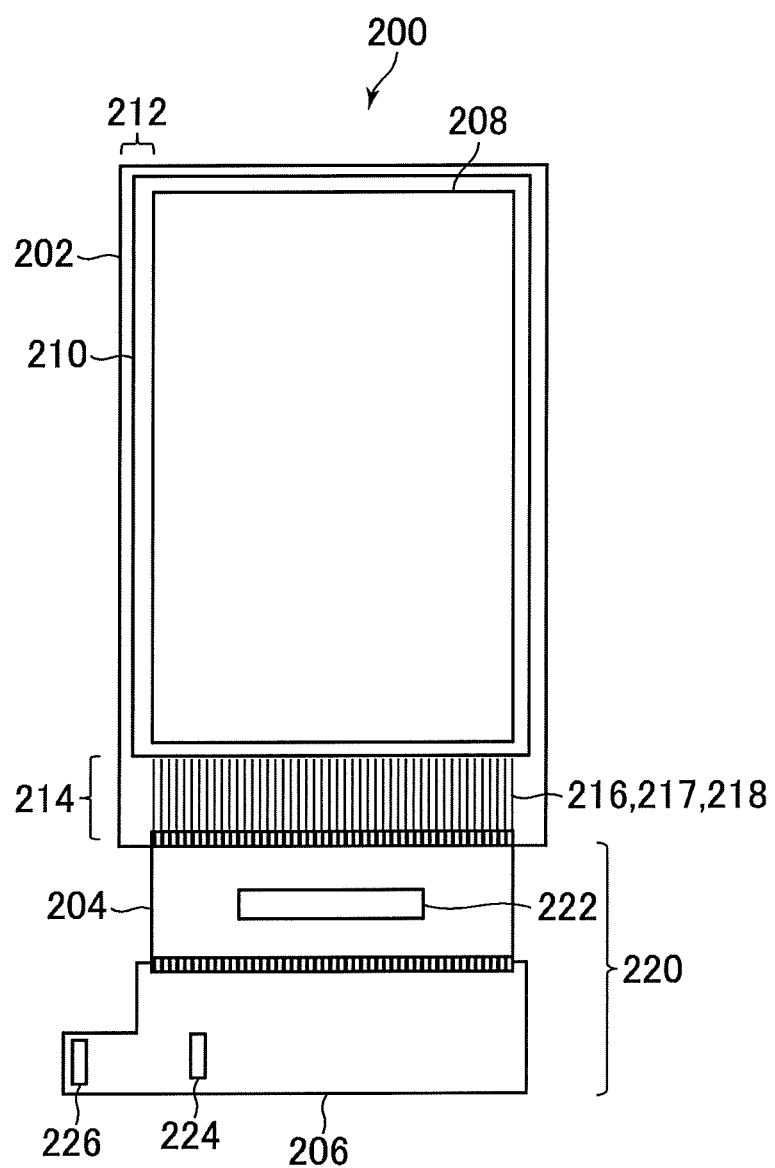
FIG. 2 is a diagram showing the configuration of an organic EL panel as viewed from the displaying side.

FIG. 2 is a schematic view showing the configuration of the organic EL panel 200 in FIG. 1. As shown in FIG. 2, the organic EL panel 200 is configured to include an insulating substrate 202, a first wiring substrate 204, and a second wiring substrate 206.

Each of the insulating substrate 202, the first wiring substrate 204, and the second wiring substrate 206 is a substrate made of resin, and is formed of, for example, polyimide with a thickness of 10 to 20 μm. The insulating substrate 202 includes a display region 208, a picture-frame region 212, and a curved region 214.

The display region 208 includes a pixel array section including at least one terminal. Specifically, the display region 208 includes the pixel array section in which pixels each emitting light are disposed in a matrix in a layer above an inorganic film 210 that is an under film.

The pixel array section includes terminals for supplying, to pixels, power and signals to turn on the pixels. In each pixel, a plurality of transistors 302 (to be described later) and capacitors are disposed. The terminals included in the pixel array section are, for example, terminals to which scanning signals, video signals, and power that are supplied from a drive IC 222 are input via first to third connection wirings 216, 217, and 218 to be described later.

The picture-frame region 212 is disposed around the display region 208. Specifically, the inorganic film 210 is disposed in the picture-frame region 212 so as to include the display region 208. In the picture frame on the left and right sides, circuits that generate signals to select rows in the pixel array section, and the like are disposed in a layer above the inorganic film 210. In the picture frame on the upper and lower sides, a wiring to route power, a wiring to distribute data signals, and the like are disposed.

The curved region 214 couples the display region 208 and a connection region 220 together, and includes the first connection wiring 216, the second connection wiring 217, and the third connection wiring 218, which are disposed between the pixel array section and a connection terminal section 226. The details of the first to third connection wirings 216, 217, and 218 will be described later.

The first wiring substrate 204 and the second wiring substrate 206 include the connection region 220. The connection region 220 is disposed on the rear surface side of the display region 208, and includes the connection terminal section 226 to which signals are supplied from the outside. Specifically, the connection region 220 is a region where the connection terminal section 226 for supplying signals from the outside of the organic EL panel 200 is disposed. The connection region 220 is disposed in the first wiring substrate 204 and/or the second wiring substrate 206 and thus is disposed on the rear surface side of the display region 208.

The first wiring substrate 204 is connected with the insulating substrate 202, and the drive IC 222 is disposed on the first wiring substrate 204. The drive IC 222 supplies, via the first to third connection wirings 216, 217, and 218, the data signal and power supply voltage supplied from the second wiring substrate 206 to the pixel. The pixel emits light with the power and data signal. With this configuration, an image is displayed in the display region 208.

The second wiring substrate 206 is connected with the first wiring substrate 204, and the connection terminal section 226 and a circuit component 224 are disposed on the second wiring substrate 206. The connection terminal section 226 is, for example, a connector for external connection, and is connected with an external device that supplies power and data signals to the organic EL panel 200.

The connection terminal section 226 supplies the power and data signals to an electronic circuit (not shown) formed of the circuit component 224. The power and data signals generated by the electronic circuit are supplied to the drive IC 222 or the pixel array section via the first to third connection wirings 216, 217, and 218.

Figure 3:
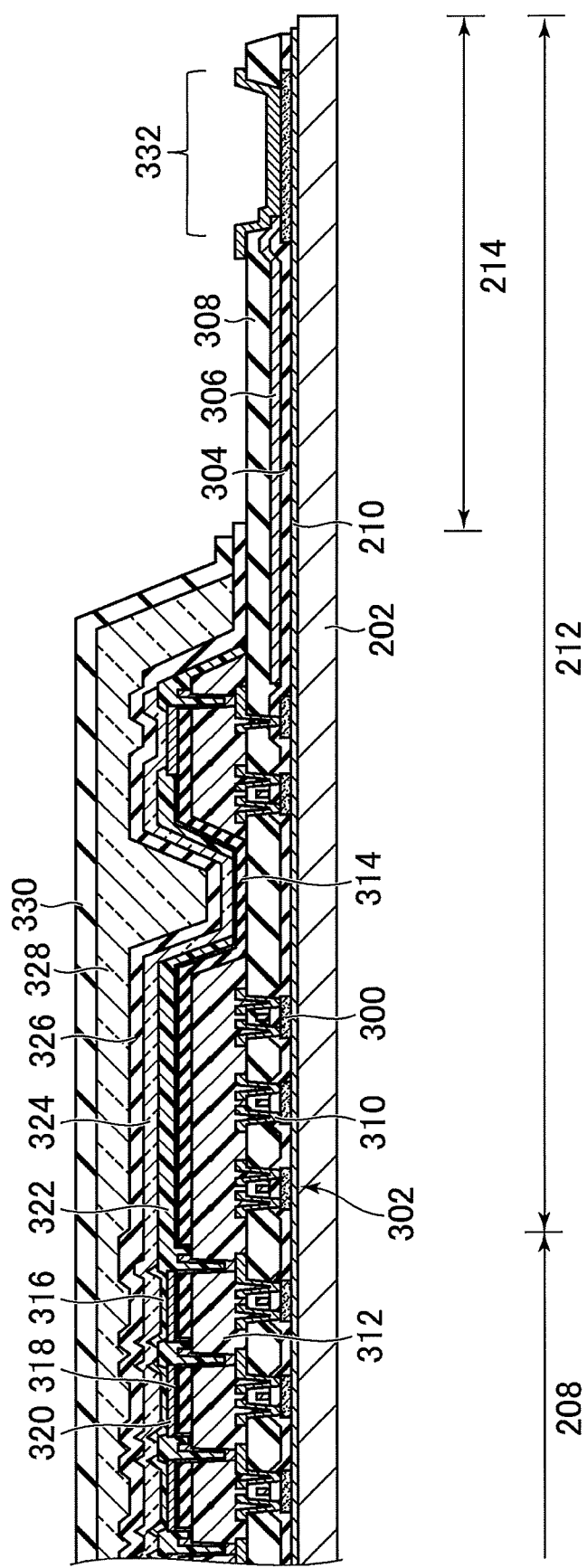
FIG. 3 is a diagram for explaining a cross-section of the organic EL panel.

Subsequently, a cross-section of the organic EL panel 200 in a state before being curved will be described. FIG. 3 is a diagram showing a cross-section from the display region 208 to the curved region 214 in FIG. 2. A cross-sectional view (see FIG. 5) in a curved state to be described later illustrates a configuration in which the organic EL panel 200 includes a spacer and a reinforcing film; however, in FIG. 3, the spacer, the reinforcing film, and the like are omitted.

The insulating substrate 202 is a film having flexibility, such as polyimide or polyethylene terephthalate. The inorganic film 210 serving as a barrier to impurities contained in the insulating substrate 202 is disposed on the surface of the insulating substrate 202. The inorganic film 210 is an under film. The inorganic film 210 is formed of a three- or five-layered film in which nitride films and oxide films are alternately disposed. The nitride film and the oxide film have a thickness of 20 to 50 nm or 100 to 500 nm.

A semiconductor layer 300 is disposed on the inorganic film 210. The channel, source, and drain regions of the transistor 302 of a pixel circuit or the transistor 302 of a peripheral circuit are formed of the semiconductor layer 300. The semiconductor layer 300 is a p-Si layer that is formed by subjecting an a-Si layer to an excimer laser annealing (ELA) process. The semiconductor layer 300 has a thickness of, for example, 50 nm.

A gate insulating film 304 is formed of silicon oxide or the like on the semiconductor layer 300. The gate insulating film 304 is formed of, for example, $Si(OC_2H_5)_4$ with a thickness of 80 to 100 nm.

A first wiring layer 306 is disposed on the gate insulating film 304. Specifically, the first wiring layer 306 is formed of MoW. The first wiring layer 306 may be formed by stacking Ti with a thickness of 100 to 200 nm, TiAl with a thickness of 100 to 300 nm, and Ti with a thickness of 100 to 200 nm. The first wiring layer 306 is used as a gate electrode of the transistor 302 in the pixel array section.

A first inorganic insulating film 308 is disposed as an inter-layer insulating film so as to cover the first wiring layer 306 and the like. The first inorganic insulating film 308 is formed by stacking, for example, a nitride film with a thickness of 300 nm and an oxide film with a thickness of 300 to 400 nm.

A second wiring layer 310 is disposed on the first inorganic insulating film 308. The second wiring layer 310 is formed by stacking, for example, Mo with a thickness of 100 to 200 nm, AlNd with a thickness of 300 to 600 nm, and Mo with a thickness of 30 to 100 nm. The second wiring layer 310 may be formed by stacking Ti, Al, and Ti. The second wiring layer 310 includes a wiring that electrically connects a lower electrode 320 and a reflection film 318 with the semiconductor layer 300 of the transistor 302 via a contact hole that penetrates the gate insulating film 304 and the inorganic film 210.

The first wiring layer 306 and the second wiring layer 310 are disposed also in the curved region 214 described above. The first wiring layer 306 disposed in the curved region 214 includes the first connection wiring 216 and the second connection wiring 217. The second wiring layer 310 includes the third connection wiring 218.

An organic planarization film 312 is disposed using an organic material so as to cover the second wiring layer 310. The organic planarization film 312 is formed of polyimide, acrylic resin, or the like with a thickness of 2 to 3 μm. The organic planarization film 312 planarizes steps in a layer below the organic planarization film 312.

A second inorganic insulating film 314 is disposed on the surface of the organic planarization film 312. The second inorganic insulating film 314 is formed of a material having moisture-proofness and an insulating property. For example, the second inorganic insulating film 314 is formed by stacking a nitride film and an oxide film. The second inorganic insulating film 314 may be formed of a nitride film with a thickness of 200 nm. The second inorganic insulating film 314 prevents the entry of moisture from the organic planarization film 312 and the like to an organic EL film 316.

The reflection film 318 and the lower electrode 320 are disposed on the second inorganic insulating film 314. The reflection film 318 is formed of, for example, a light-reflecting material such as MgAg. The lower electrode 320 is electrically connected to a source electrode of the transistor 302 through a contact hole that penetrates the second inorganic insulating film 314 and the organic planarization film 312.

Specifically, for example, the lower electrode 320 is formed by stacking indium tin oxide with a thickness of 30 to 60 nm, silver with a thickness of 100 to 150 nm, and indium tin oxide with a thickness of 10 to 20 nm. Instead of indium tin oxide, indium zinc oxide may be used. The lower electrode 320 corresponds to an anode of an organic EL element where each pixel is disposed.

An organic bank 322 is disposed on the reflection film 318 and the lower electrode 320. The organic bank 322 is disposed along the boundary between pixels, and includes openings at positions on the light-emitting surface of the organic EL film 316. The organic EL film 316 including a light-emitting layer is disposed at the bottom of the opening. The organic bank 322 is disposed using polyimide, acrylic resin, or the like with a thickness of 1 to 2 µm.

The organic EL film 316 is formed to include a hole injection layer, a hole transport layer, the light-emitting layer, an electron injection layer, and an electron transport layer. The light-emitting layer is formed using a material that emits light of red, green, and blue for each pixel.

An upper electrode 324 is disposed on the organic EL film 316. The upper electrode 324 is disposed from the display region 208 over the picture-frame region 212. The upper electrode 324 is a common electrode covering the pixels in the entire pixel array section. The upper electrode 324 is formed of a material that transmits light emitted by the organic EL film 316.

For example, the upper electrode 324 is formed of a transparent conductive material such as indium zinc oxide or indium tin oxide. The upper electrode 324 is electrically connected through a contact hole with the lower electrode 320 formed in the picture-frame region 212. The upper electrode 324 corresponds to a cathode of the organic EL element where each pixel is disposed.

A sealing film is disposed in the entire display region 208. Specifically, the sealing film is disposed in the entire display region 208 where the organic EL element including the lower electrode 320, the organic EL film 316, and the upper electrode 324 is disposed. The sealing film seals the upper surface of the organic EL film 316. With this configuration, the sealing film prevents the degradation of the organic EL film 316 due to moisture in the organic EL film 316.

Specifically, the sealing film is formed by stacking a first inorganic sealing film 326, an organic sealing film 328, and a second inorganic sealing film 330. For example, the sealing film is formed by stacking a nitride film with a thickness of 1 to 10 µm, a resin layer with a thickness of 5 to 50 µm, and a nitride film with a thickness of 1 to 10 µm.

The display panel includes at its right edge in FIG. 3 a contact section 332 where the second wiring layer 310 is exposed. The second wiring layer 310 and terminals that are disposed on the first wiring substrate 204 are electrically connected at the contact section 332.

Figure 4:
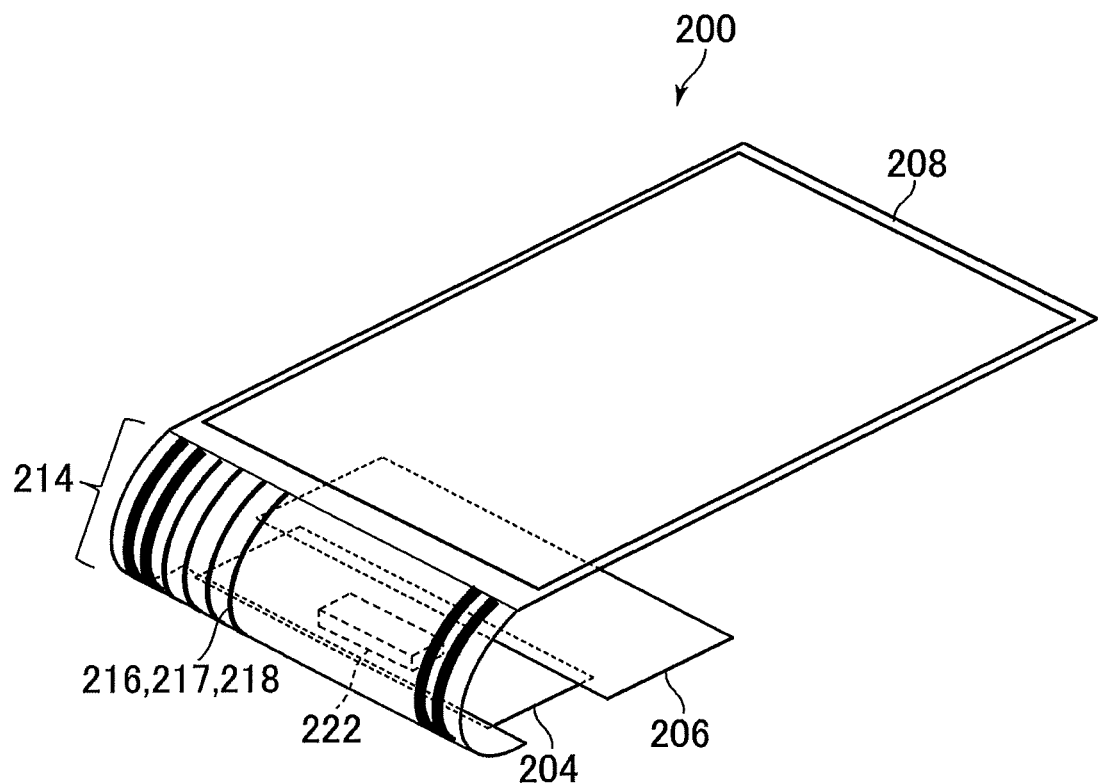
FIG. 4 is a diagram showing the curved state of the organic EL panel.

Subsequently, the organic EL panel 200 in a state after being curved will be described. The organic EL panel 200 is curved after the first wiring substrate 204 is connected to the contact section 332. FIG. 4 is a bird's-eye view of the organic EL panel 200 in the curved state.

With the curved region 214 being curved, the first wiring substrate 204 and the second wiring substrate 206 are disposed on the rear side of the display region 208. Moreover, stress is applied to the first to third connection wirings 216, 217, and 218 due to curving.

Figure 5:
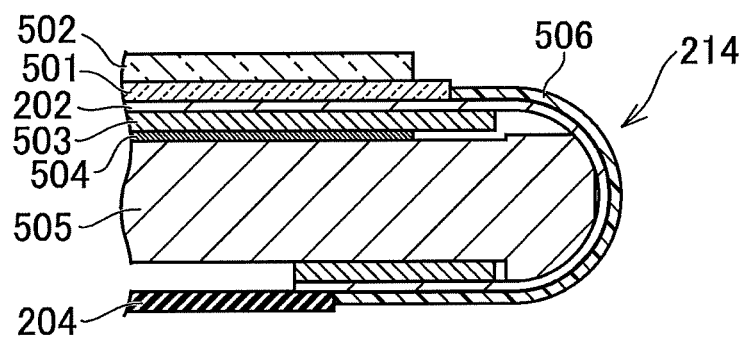
FIG. 5 is a di showing a cross-section of the curved organic EL panel.

FIG. 5 is a diagram showing a schematic cross-section of the organic EL panel 200 in the vicinity of the curved region 214. As shown in FIG. 5, the organic EL panel 200 includes the insulating substrate 202, a protective film 501, a polarizer 502, a first reinforcing film 503, a thermal diffusion sheet 504, a spacer 505, and a second reinforcing film 506.

The insulating substrate 202 is curved at the curved region 214. FIG. 3 illustrates a configuration in which the inorganic film 210 to the second inorganic sealing film 330 are disposed on the insulating substrate 202; however, the inorganic film 210 to the second inorganic sealing film 330 are omitted herein.

The protective film 501 is a film that protects the organic EL panel 200. Specifically, the protective film 501 is a film that protects the surface of the second inorganic sealing film 330 disposed over the insulating substrate 202.

The polarizer 502 reduces the reflection of external light incident on the organic EL panel 200. This improves the visibility of the organic EL display device 100.

The first reinforcing film 503 is a film that reinforces the organic EL panel 200. The first reinforcing film 503 is disposed in a flat region of the organic EL panel 200 in the curved state. Specifically, the first reinforcing film 503 is disposed on the rear surface of the display region 208 of the organic EL panel 200.

The thermal diffusion sheet 504 is a sheet that diffuses the heat of the organic EL panel 200. Specifically, the thermal diffusion sheet 504 diffuses heat generated in a drive circuit disposed around the organic EL panel 200 into the entire organic EL panel 200. This prevents the organic EL panel 200 from being brought into a state where only a portion thereof is heated up to a high temperature.

The spacer 505 is disposed between a front surface-side portion and a rear surface-side portion of the folded organic EL panel 200. The spacer 505 keeps the gap between the front surface-side portion and the rear surface-side portion at a constant value or more. With this configuration, even when pressure in the thickness direction is applied to the organic EL panel 200, the curvature of the curved region 214 is kept within an allowable range.

The edge portion of the spacer 505 is formed so as to be a curved surface having a curvature corresponding to the back surface of the curved region 214. By abutting the edge portion of the spacer 505 onto the back surface of the curved region 214, the shape of the curved region 214 can be kept constant even when pressure is applied to the surface of the curved region 214. With the spacer 505, the stress applied to the first to third connection wirings 216, 217, and 218 disposed in the curved region 214 can be reduced, and thus the disconnection of the first to third connection wirings 216, 217, and 218 can be less likely to occur.

The second reinforcing film 506 is a film that reinforces the organic EL panel 200. The second reinforcing film 506 is disposed in the curved region 214 of the organic EL panel 200 in the curved state. The second reinforcing film 506 is formed of a material and thickness that is bent more easily than the first reinforcing film 503.

The organic EL panel 200 may employ a configuration in which the second reinforcing film 506 is not attached to the curved region 214. According to the configuration, the softness of the curved region 214 can be increased, and thus the organic EL panel 200 can be curved with a smaller curvature radius. As the curvature radius of the curved region 214 becomes smaller, the plan-view size of the folded organic EL panel 200 is reduced, and also, the thickness of the folded organic EL panel 200 is reduced.

As described above, the first wiring substrate 204 and the second wiring substrate 206 located ahead of the curved region 214, as viewed from the display region 208, can be folded back onto the rear side of the display region 208. By folding back the first and second wiring substrates as described above, the plan-view size of the organic EL panel 200 can be reduced, and thus it is possible to achieve the miniaturization of the organic EL display device 100 in which the organic EL panel 200 is mounted. Moreover, since a portion of the organic EL panel 200 that is located ahead of the curved region 214 of the insulating substrate 202 is hidden at the rear surface, the ratio of the display region 208 occupying the front of the organic EL display device 100 can be increased.

Further, the drive IC 222 and the like are mounted on a portion of the organic EL panel 200 that is folded back onto the rear surface, and the picture-frame region 212 appearing on the display surface side is not used as an arrangement region for a component such as an IC. Therefore, the area of the picture-frame region 212 can be reduced. That is, a so-called narrower picture frame in the organic EL display device 100 can be progressed.

Subsequently, the first to third connection wirings 216, 217, and 218 will be described. In the following description, a state before the curved region 214 is curved will be described unless otherwise noted.

FIGS. 6A and 6B are diagrams of the first wiring layer 306 (the first connection wiring 216 and the second connection wiring 217) disposed in the curved region 214 as viewed in plan, in which the other configuration elements are omitted. FIGS. 6C and 6D are diagrams of the second wiring layer 310 (the third connection wiring 218) disposed in the curved region 214 as viewed in plan, in which the other configuration elements are omitted. In an actual curved region 214, the first to third connection wirings 216, 217, and 218 are disposed in a state where FIGS. 6A and 6C are combined together or in a state where FIGS. 6B and 6D are combined together.

A running direction 600 shown in FIGS. 6A to 6D is a direction in which the first to third connection wirings 216, 217, and 218 run from the connection region 220 toward the pixel array section included in the display region 208. The running direction 600 may be a direction in which the first to third connection wirings 216, 217, and 218 run from the pixel array section toward the connection region 220.

The first connection wiring 216 and the second connection wiring 217 are disposed spaced apart from and in parallel with each other. The first connection wiring 216 and the second connection wiring 217 include regions that run obliquely with respect to the running direction 600. The first connection wiring 216 and the second connection wiring 217 each include alternately a region (for example, a first region 351 of the first connection wiring 216 and a third region 353 of the second connection wiring 217) that is disposed obliquely on the right side (for example, in a first direction 361) and a region (for example, a second region 352 of the first connection wiring 216 and a fourth region 354 of the second connection wiring 217) that is disposed obliquely on the left side (for example, in a second direction 362), in the drawings of FIGS. 6A and 6B, with respect to the running direction 600.

More specifically, the first and second connection wirings 216 and 217 adjacent to each other are disposed at an equal interval in any of the region disposed obliquely on the right side and the region disposed obliquely on the left side. Moreover, the first and second connection wirings 216 and 217 adjacent to each other are disposed such that an interval therebetween in the region disposed obliquely on the right side and an interval therebetween in the region disposed obliquely on the left side are equal to each other. Moreover, the first and second connection wirings 216 and 217 are formed with the same width in the region disposed obliquely on the right side and the region disposed obliquely on the left side. Further, the first and second connection wirings 216 and 217 each include a bending point corresponding to the boundary between the region disposed obliquely on the right side and the region disposed obliquely on the left side. It is desirable that a plurality of the bending points are included. By including a plurality of bending points, the first and second connection wirings 216 and 217 are formed in a zigzag shape.

Figure 7A:
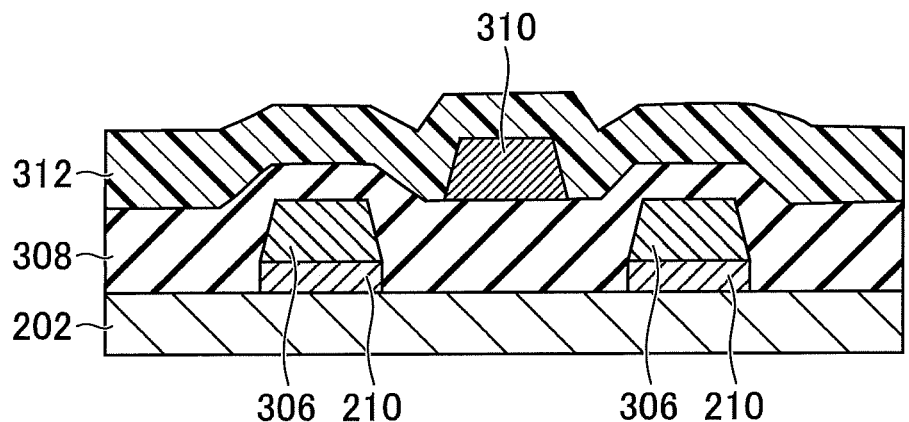
FIGS. 7A to 7C are diagrams of the first to third connection wirings as viewed in cross-section.
Figure 7B:
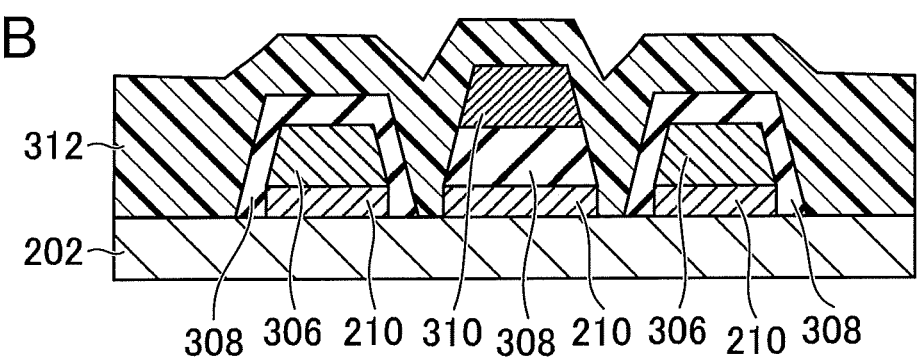
Figure 7C:
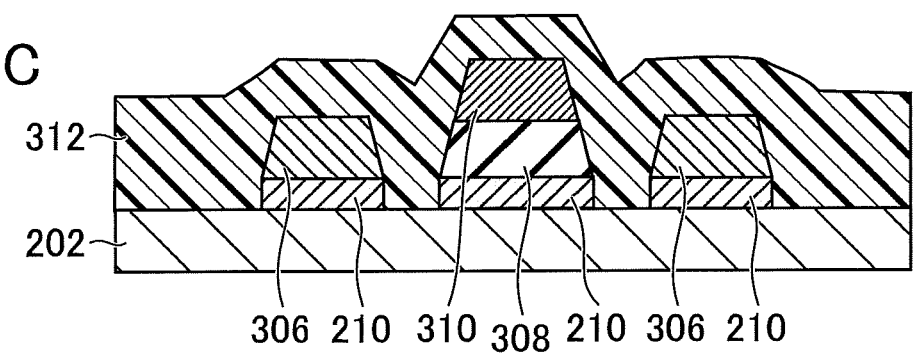

The third connection wiring 218 is disposed between the first connection wiring 216 and the second connection wiring 217 in a plan view. Specifically, as shown in FIGS. 7A to 7C, the third connection wiring 218 (the second wiring layer 310) is formed in a layer above the first connection wiring 216 and the second connection wiring 217 (the first wiring layer 306).

The third connection wiring 218 includes alternately a region (for example, a fifth region 355) that is disposed obliquely on the right side (for example, in the first direction 361) and a region (for example, a sixth region 356) that is disposed obliquely on the left side (for example, in the second direction 362), in the drawings of FIGS. 6C and 6D, with respect to the running direction 600. The third connection wiring 218 is disposed between the first connection wiring 216 and the second connection wiring 217 in the plan view. The third connection wiring 218 is disposed in parallel with the first and second connection wirings 216 and 217 in the plan view.

The first to third connection wirings 216, 217, and 218 are wirings that electrically connect the pixel array section with the connection terminal section 226. Specifically, for example, a power supply voltage is input to the first to third connection wirings 216, 217, and 218 shown in FIGS. 6A and 6C. With this configuration, the first to third connection wirings 216, 217, and 218 shown in FIGS. 6A and 6C supply the power supply voltage applied to the connection terminal section 226 to the pixel array section.

Each of the first to third connection wirings 216, 217, and 218 is physically connected at its both ends with wiring terminals. The first to third connection wirings 216, 217, and 218 are provided with intervals and are not in contact with each other. That is, the first connection wiring 216 is electrically connected with the second and third connection wirings 217 and 218 in the picture-frame region 212 disposed around the display region 208 and in the connection region 220. Specifically, the first to third connection wirings 216, 217, and 218 are connected with a common wiring in the picture-frame region 212 and the connection region 220.

With this configuration, the power supply voltage applied to the connection terminal section 226 is supplied to the pixel array section through the three connection wirings, that is, the first to third connection wirings 216, 217, and 218. Hence, compared to the case where the picture-frame region 212 and the connection region 220 are connected with one or two connection wirings, an electrical resistance can be reduced.

As shown in FIG. 6B, the second connection wiring 217 may be omitted. Specifically, as shown in FIGS. 6B and 6D, the third connection wiring 218 is disposed between two first connection wirings 216.

In this case, the first connection wiring 216 and the third connection wiring 218 are electrically insulated from each other in the picture-frame region 212 and the connection region 220. Specifically, for example, the first and third connection wirings 216 and 218 are connected with different wirings in the picture-frame region 212 and the connection region 220.

Moreover, in this case, signals are supplied to the first and third connection wirings 216 and 218 shown in FIGS. 6B and 6D. For example, differential signals that are video signals are input to the first and third connection wirings 216 and 218 shown in FIGS. 6B and 6D.

An insulating layer that electrically insulates the first and second connection wirings 216 and 217 from the third connection wiring 218 is disposed between the first wiring layer 306 and the second wiring layer 310 in the curved region 214. The first and second connection wirings 216 and 217 and the third connection wiring 218 are insulated from each other by the insulating layer.

Subsequently, a cross-sectional configuration of the first to third connection wirings 216, 217, and 218 will be described with reference to FIGS. 7A to 7C.

FIGS. 7A to 7C are diagrams showing cross-sections along line VII-VII in FIGS. 6A and 6C. As shown in FIG. 7A, the inorganic film 210 is disposed below regions where the first connection wiring 216 and the second connection wiring 217 are provided. As shown in FIGS. 7B and 7C, the inorganic film 210 may be disposed in regions below regions where the third connection wiring 218 is provided.

The first wiring layer 306 is disposed on the inorganic film 210. Specifically, the first wiring layer 306 that is the first connection wiring 216 is disposed on the inorganic film 210 shown on the left side in FIG. 7A. The first wiring layer 306 that is the second connection wiring 217 is disposed on the inorganic film 210 shown on the right side in FIG. 7A.

The first inorganic insulating film 308 is disposed so as to cover the inorganic film 210 and the first wiring layer 306. As shown in FIG. 7B, the first inorganic insulating film 308 may be configured such that the first inorganic insulating film 308 is disposed only around the first and second connection wirings 216 and 217 and below the third connection wiring 218. Moreover, as shown in FIG. 7C, the first inorganic insulating film 308 may be configured such that the first inorganic insulating film 308 is disposed only below the third connection wiring 218.

The second wiring layer 310 is disposed on the first inorganic insulating film 308. Specifically, the second wiring layer 310 that is the third connection wiring 218 is disposed on the first inorganic insulating film 308 in a region that is located to the right of the first wiring layer 306 that is the first connection wiring 216 and to the left of the first wiring layer 306 that is the second connection wiring 217.

FIG. 7A illustrates a configuration in which the second wiring layer 310 is disposed in a position not overlapping the first wiring layer 306 in a plan view; however, the second wiring layer 310 may be disposed in a position overlapping a portion of the first wiring layer 306 in the plan view. That is, the first to third connection wirings 216, 217, and 218 may have constant intervals therebetween in the plan view, and the first to third connection wirings 216, 217, and 218 may not overlap each other in the plan view. On the other hand, the first connection wiring 216 and the third connection wiring 218 may overlap each other, and the second connection wiring 217 and the third connection wiring 218 may overlap each other.

The organic planarization film 312 is disposed so as to cover the second wiring layer 310. Specifically, the organic planarization film 312 is disposed so as to cover the second wiring layer 310 that is the third connection wiring 218, and the first inorganic insulating film 308.

As shown in FIG. 7C, when the first inorganic insulating film 308 is configured such that the first inorganic insulating film 308 is disposed only below the third connection wiring 218, the organic planarization film 312 is disposed so as to cover the second wiring layer 310 that is the third connection wiring 218, and the first wiring layer 306.

Figure 8A:
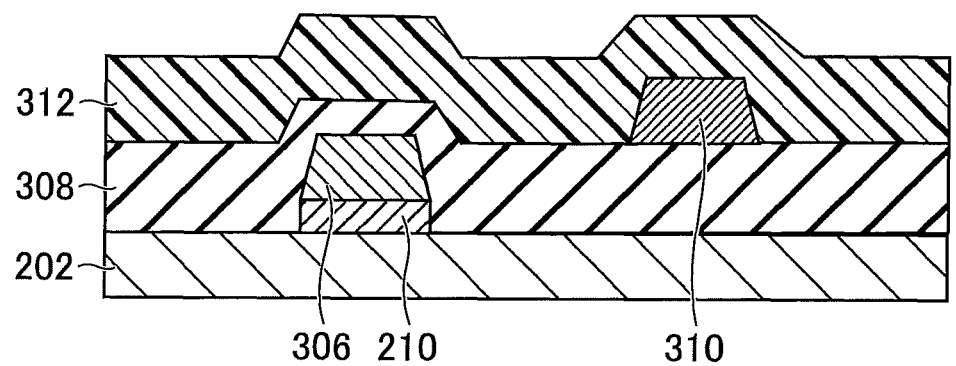
FIGS. 8A to 8C are diagrams of the first to third connection wirings as viewed in cross-section.
Figure 8B:
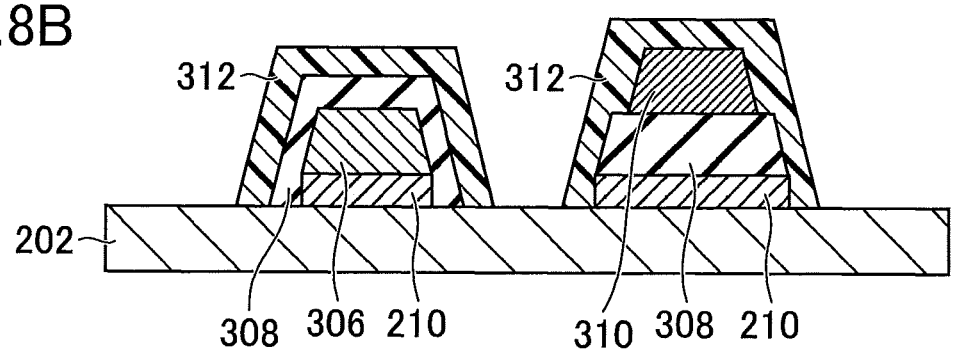
Figure 8C:
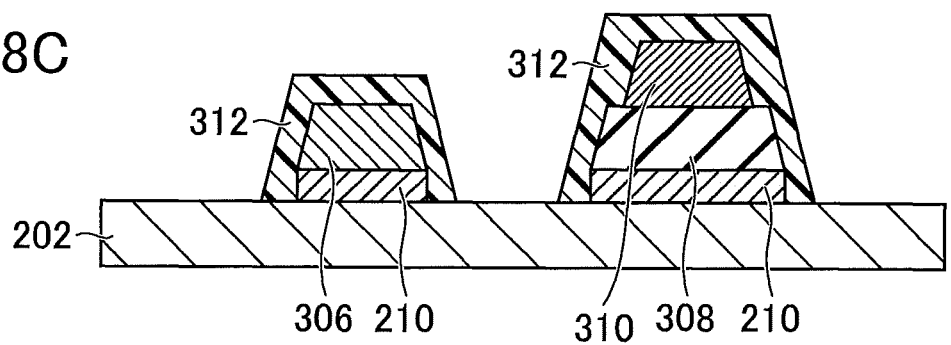

FIGS. 8A to 8C are diagrams showing cross-sections along line VIII-VIII in FIGS. 6B and 6D. As shown in FIG. 8A, the inorganic film 210 is disposed below a region where the first connection wiring 216 is provided. As shown in FIGS. 8B and 8C, the inorganic film 210 may be disposed below regions where the third connection wiring 218 is provided.

The first wiring layer 306 is disposed on the inorganic film 210. Specifically, the first wiring layer 306 that is the first connection wiring 216 is disposed on the inorganic film 210.

The first inorganic insulating film 308 is disposed so as to cover the inorganic film 210 and the first wiring layer 306. As shown in FIG. 8B, the first inorganic insulating film 308 may be configured such that the first inorganic insulating film 308 is disposed only around the first connection wiring 216 and below the third connection wiring 218. Moreover, as shown in FIG. 8C, the first inorganic insulating film 308 may be configured such that the first inorganic insulating film 308 is disposed only below the third connection wiring 218.

The second wiring layer 310 is disposed on the first inorganic insulating film 308. Specifically, the second wiring layer 310 that is the third connection wiring 218 is disposed on the first inorganic insulating film 308 in a region that is located to the right of the first wiring layer 306 that is the first connection wiring 216.

FIG. 8A illustrates a configuration in which the second wiring layer 310 is disposed in a position not overlapping the first wiring layer 306 in a plan view; however, the second wiring layer 310 may be disposed in a position overlapping a portion of the first wiring layer 306 in the plan view.

The organic planarization film 312 is disposed so as to cover the second wiring layer 310. Specifically, the organic planarization film 312 is disposed so as to cover the second wiring layer 310 that is the third connection wiring 218, and the first inorganic insulating film 308.

As shown in FIG. 8C, when the first inorganic insulating film 308 is configured such that the first inorganic insulating film 308 is disposed only below the third connection wiring 218, the organic planarization film 312 is disposed so as to cover the second wiring layer 310 that is the third connection wiring 218, and the first wiring layer 306.

As described above, the first to third connection wirings 216, 217, and 218 are configured using the first wiring layer 306 and the second wiring layer 310, so that the arrangement area per connection wiring can be reduced. This can improve the arrangement density of connection wirings.

Further, by obliquely disposing the first to third connection wirings 216, 217, and 218 with respect to the running direction 600, the disconnection of the first to third connection wirings 216, 217, and 218 can be prevented even when stress is applied to the first to third connection wirings 216, 217, and 218.

When the first connection wiring 216 and the third connection wiring 218 are electrically insulated from each other like the first connection wiring 216 shown in FIG. 6B and the third connection wiring 218 shown in FIG. 6D, one of differential signals may be input to the first connection wiring 216 and the other differential signal may be input to the third connection wiring 218 combined with the first connection wiring 216. Inputting a pair of differential signals can reduce radiation noise.

In the above embodiment, an embodiment in which the inorganic film 210 is disposed below the first wiring layer 306 in the curved region 214 has been described; however, the inorganic film 210 may be omitted. Moreover, instead of the organic planarization film 312, the second inorganic insulating film 314 may be disposed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
an insulating substrate including a display region;
a contact section disposed outside the display region and on the insulating substrate; and
first connection wiring, second connection wiring, and third connection wiring which are connected with the contact section, each of the first to third connection wirings is located between the contact section and the display region, wherein
the second connection wiring is located in a same layer as the first connection wiring,
the third connection wiring is located in a layer different from the first connection wiring,
the first connection wiring includes at least one first region running in a first direction and at least one second region running in a second direction different from the first direction,
the second connection wiring includes at least one third region running in the first direction and at least one fourth region running in the second direction,
the third connection wiring includes at least one fifth region running in the first direction and at least one sixth region running in the second direction, and
the at least one first region, the at least one third region, and the at least one fifth region are adjacent to one another.

2. The display device according to claim 1, wherein the at least one second region, the at least one fourth region, and the at least one sixth region are adjacent to one another.

3. The display device according to claim 1, wherein
the at least one first region includes first regions,
the at least one second region includes second regions, and
the first regions and the second regions are arranged alternately one by one.

4. The display device according to claim 1, wherein the first connection wiring is electrically connected with the second connection wiring and the third connection wiring.

5. The display device according to claim 4, wherein
a pixel is located in the display region,
a power supply voltage is supplied to the pixel, and
the power supply voltage is applied to the first connection wiring.

6. The display device according to claim 1, wherein
a curved region where the insulating substrate is curved is located between the contact section and the display region, and
a portion of the first connection wiring, a portion of the second connection wiring, and a portion of the third connection wiring are located in the curved region.

7. The display device according to claim 1, wherein
the first connection wiring is covered with a first inorganic insulating film, and
the third connection wiring is located on the first inorganic insulating film.

8. The display device according to claim 7, wherein the first inorganic insulating film includes a first portion covering the first connection wiring, and a second portion separated from the first portion and covering the second connection wiring.

9. The display device according to claim 8, wherein
the first inorganic insulating film includes a third portion separated from the first portion and the second portion, and
the third connection wiring is located on the third portion.

10. The display device according to claim 1, further comprising an under film and a first inorganic insulating film located between the under film and the third connection wiring, wherein
the first connection wiring is located on the under film, and
the first inorganic insulating film does not overlap the first connection wiring.

11. The display device according to claim 1, wherein the third connection wiring is located between the first connection wiring and the second connection wiring in a plan view.

12. The display device according to claim 1, wherein
a pixel and a thin film transistor are located in the display region, and
the first connection wiring is located in a same layer as a gate electrode of the thin film transistor.

13. The display device according to claim 1, wherein
a pixel and a thin film transistor are located in the display region,
the pixel includes a lower electrode, an upper electrode, and a light-emitting layer,
the thin film transistor and the lower electrode are connected by a wiring, and
the third connection wiring is located in a same layer as the wiring.

14. A display device comprising:
an insulating substrate including a display region;
a contact section disposed outside the display region and on the insulating substrate; and
a first connection wiring and a third connection wiring which are connected with the contact section and both of the first and third connection wirings is located between the contact section and the display region, wherein
the third connection wiring is located in a layer different from the first connection wiring,
the first connection wiring includes at least one first region running in a first direction and at least one second region running in a second direction different from the first direction,
the third connection wiring includes at least one fifth region running in the first direction and at least one sixth region running in the second direction, and
the at least one first region and the at least one fifth region are adjacent to each other.

15. The display device according to claim 14, wherein the at least one second region and the at least one sixth region are adjacent to each other.

16. The display device according to claim 14, wherein
the at least one first region includes first regions,
the at least one second region includes second regions, and
the first regions and the second regions are arranged alternately one by one.

17. The display device according to claim 14, wherein
a curved region where the insulating substrate is curved is located between the contact section and the display region, and
a portion of the first connection wiring and a portion of the third connection wiring are located in the curved region.

18. The display device according to claim 14, wherein
the first connection wiring is covered with a first inorganic insulating film, and
the third connection wiring is located on the first inorganic insulating film.

19. The display device according to claim 18, wherein
the first inorganic insulating film includes a first portion covering the first connection wiring, and a third portion separated from the first portion, and
the third connection wiring is located on the third portion.

20. The display device according to claim 14, wherein
a pixel and a thin film transistor are located in the display region,
the pixel includes a lower electrode, an upper electrode, and a light-emitting layer,
the thin film transistor and the lower electrode are connected by a wiring,
the first connection wiring is located in a same layer as a gate electrode of the thin film transistor, and
the third connection wiring is located in a same layer as the wiring.

\* \* \* \* \*